United States Patent
Oda

(10) Patent No.: US 8,035,411 B2
(45) Date of Patent: Oct. 11, 2011

(54) SEMICONDUCTOR INTEGRATED CIRCUIT INCLUDING A POWER CONTROLLABLE REGION

(75) Inventor: Yasuhiro Oda, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/656,596

(22) Filed: Feb. 4, 2010

(65) Prior Publication Data

US 2010/0237900 A1  Sep. 23, 2010

(30) Foreign Application Priority Data

Mar. 19, 2009 (JP) ................................ 2009-067758

(51) Int. Cl.
 *H03K 19/00* (2006.01)
(52) U.S. Cl. .............................. 326/16; 714/726; 326/62
(58) Field of Classification Search .................... 326/16, 326/62, 31, 33, 26, 101; 716/4; 714/724, 714/726

See application file for complete search history.

(56) References Cited

U.S. PATENT DOCUMENTS

| | | | | |
|---|---|---|---|---|
| 7,002,834 B2 * | 2/2006 | Yokozeki | ....................... | 365/145 |
| 7,042,245 B2 * | 5/2006 | Hidaka | ........................... | 326/34 |
| 7,263,640 B2 | 8/2007 | Kobayashi | | |
| 7,310,795 B2 * | 12/2007 | Tsukamoto | ..................... | 716/17 |

FOREIGN PATENT DOCUMENTS

JP  2006-170663  6/2006

* cited by examiner

*Primary Examiner* — Daniel D Chang
(74) *Attorney, Agent, or Firm* — McGinn IP Law Group, PLLC

(57) ABSTRACT

Provided is a semiconductor integrated circuit capable of testing power control operation in the semiconductor integrated circuit including a power controllable region. Power control switches have switch series each constituted by a plurality of switch cells. A power controllable region includes output nodes in the switch series. The output nodes output power control signals that have passed through final stages of the respective switch series of the power control switches to the outside of the power controllable region. A chip on which the semiconductor integrated circuit is mounted has output terminals that output outputs of the output nodes to the outside of the chip. In the case of inserting a scan path test, observation flip-flops that load the outputs of the output nodes to data terminals, and load scan data to scan-in terminals are disposed in correspondence with the respective output nodes. Those observation flip-flops are connected to constitute a scan path chain.

16 Claims, 15 Drawing Sheets

SEMICONDUCTOR INTEGRATED CIRCUIT INCLUDING A POWER CONTROLLABLE REGION

BACKGROUND OF THE INVENTION

1. Field of the Invention

The present invention relates to a semiconductor integrated circuit including a power controllable region. More particularly, the present invention relates to a semiconductor integrated circuit including a region whose power supply can be controlled to be on/off, into which a test circuit is incorporated, and to a method of designing the semiconductor integrated circuit.

2. Description of the Related Art

In recent years, lower power consumption of electronic devices has been strongly demanded, and therefore the use of a semiconductor integrated circuit having a power supply control function is being advanced.

FIG. 14 is a layout diagram illustrating a semiconductor integrated circuit including a power controllable region.

In a semiconductor integrated circuit 10, there are wired a power supply VDD serving as a PAD supply power, and a grounded power supply GND serving as a PAD supply GND.

Then, the semiconductor integrated circuit 10 includes an always-on region 11 whose power supply is normally on, and a power controllable region 12 whose power supply can be controlled to be on/off by power supply control.

A power supply VSD is wired into the power controllable region 12 as a power supply, and the power controllable region 12 operates due to the power supply from the power supply VSD.

Power control switches 13A and 13B are disposed between the power supply VDD and the power supply VSD, and the power control switches 13A and 13B are controlled in on/off operation according to a power control signal CTL input from the outside of the power controllable region 12.

FIG. 15 is a circuit diagram of the power supply control.

A plurality of semiconductor switches 14 (PMOS transistors in this example) are disposed between the power supply VDD and the power supply VSD, and a control signal line 16 is wired so that the power control signal CTL is supplied to a gate of each semiconductor switch 14.

Further, a timing adjustment buffer 15 is inserted between the respective semiconductor switches 14.

In the above-mentioned configuration, the power control switches 13A and 13B are controlled in on/off operation according to the power control signal CTL, to thereby control voltage of the power supply VSD. As a result, an appropriate voltage is applied to the power supply VSD in response to operation level of a logic circuit 18 in the power controllable region 12, and also the power supply to the power supply VSD stops when the power controllable region 12 is at rest.

As a result, leak current from the power supply VDD to the grounded power supply GND is prevented, and the lower power consumption can be realized.

A large scale integrated circuit (LSI) having a power control function and a power-off function is disclosed in JP 2006-170663 A.

The conventional power controllable region is small in area, and hence the number of semiconductor switches that constitute the power control switch may be extremely small (for example, one or two).

On the contrary, in recent years, because the power controllable region becomes large, and the operation thereof becomes complicated, the configuration of the power control switch requires a larger number of semiconductor switches.

However, an increase in the number of semiconductor switches that constitute the power control switch leads to the following problems.

For example, as illustrated in FIG. 16, when the control signal line 16 is disconnected on the way, a potential of the control signal line at the disconnected portion becomes unfixed. There may occur a defect that the semiconductor switch 14 is fixed to an always-off state due to the unfixed potential.

In this case, the semiconductor switches 14 that normally operate are only ones disposed on the left of FIG. 1, and no voltage necessary for the power supply VSD is applied.

Then, when the power controllable region 12 operates, an IR drop occurs to drop a potential of the power supply VSD.

In this case, because the always-off switch exists, the degree of voltage drop (IR drop) between the power supply lines VDD and VSD becomes large as compared with a case in which the respective switches normally operate. For that reason, a value of the voltage that is applied to the logic circuit 18 may not be a sufficient value. This leads to such problems that the logic circuit 18 malfunctions and the logic circuit 18 does not operate at a prescribed operating frequency.

Alternatively, as illustrated in FIG. 17, when the control signal line 16 is disconnected on the way, and a potential of the disconnected portion becomes unfixed, there may occur a defect that the semiconductor switch 14 is fixed to an always-on state.

In this case, even if a predetermined number or all of power control switches 13A and 13B are turned off to suppress leak current when the logic circuit 18 of the power controllable region 12 stops its operation, a current is allowed to flow from the broken always-on switch. As a result, an original objective in introducing the power control switches 13A and 13B cannot be achieved.

Further, as the number of semiconductor switches 14 constituting the power control switches 13A and 13B is larger, the number of always-on switches caused by disconnection, or the number of always-off switches caused by disconnection becomes larger. As a result, the degree of IR drop and the amount of leak current more increase.

Up to now, even if a failure occurs in the control signal line for controlling the power control switches 13A and 13B, it is very difficult to specify its cause.

For example, in the case of FIG. 16, when the malfunction of the power controllable region 12 or a slowing down of the operating frequency occurs due to the IR drop, an error is detected.

However, it is difficult to concretely identify, as its cause, whether the control signal line 16 is disconnected, the logic per se of the power control signal CTL is in error, or the transistor 14 of the power controllable region 12 is defective.

Further, in the case of FIG. 17, the presence of leak current is detected, but it is difficult to concretely identify whether the leak current is generated in the always-on region 11, or the leak current is generated in the power controllable region 12 due to the disconnection of the control signal line 16.

Accordingly, the conventional art suffers from a problem to be solved that it is impossible to specify that the malfunction of the circuit, an increase in the leak current, or the like occurs due to the disconnection of the control signal line 16.

SUMMARY

A semiconductor integrated circuit according to the present invention includes: a first power supply line configured to supply a given voltage; a second power supply line disposed separately from the first power supply line; a switch connected between the first power supply line and the second power supply line to control whether or not to supply the given voltage from the first power supply line to the second power supply line according to a inputted control signal; a first logic circuit connected to the second power supply line to operate based on a voltage generated in the second power supply line; a control signal line connected to the switch to supply the control signal to the switch; and a terminal connected to the control signal line to output the control signal that propagates through the control signal line to an outside.

With the above-mentioned configuration, a value of the power control signal can be observed from the outside. As a result, it becomes possible to specify that malfunction of the logic circuit or an increase in the leak current occurs due to disconnection of the control signal line to the switches, or those problems occur due to other factors.

BRIEF DESCRIPTION OF THE DRAWINGS

The above and other objects, advantages and features of the present invention will be more apparent from the following description of certain preferred embodiments taken in conjunction with the accompanying drawings, in which.

In the accompanying drawings.

DETAILED DESCRIPTION OF THE PREFERRED EMBODIMENTS

Figure 1:
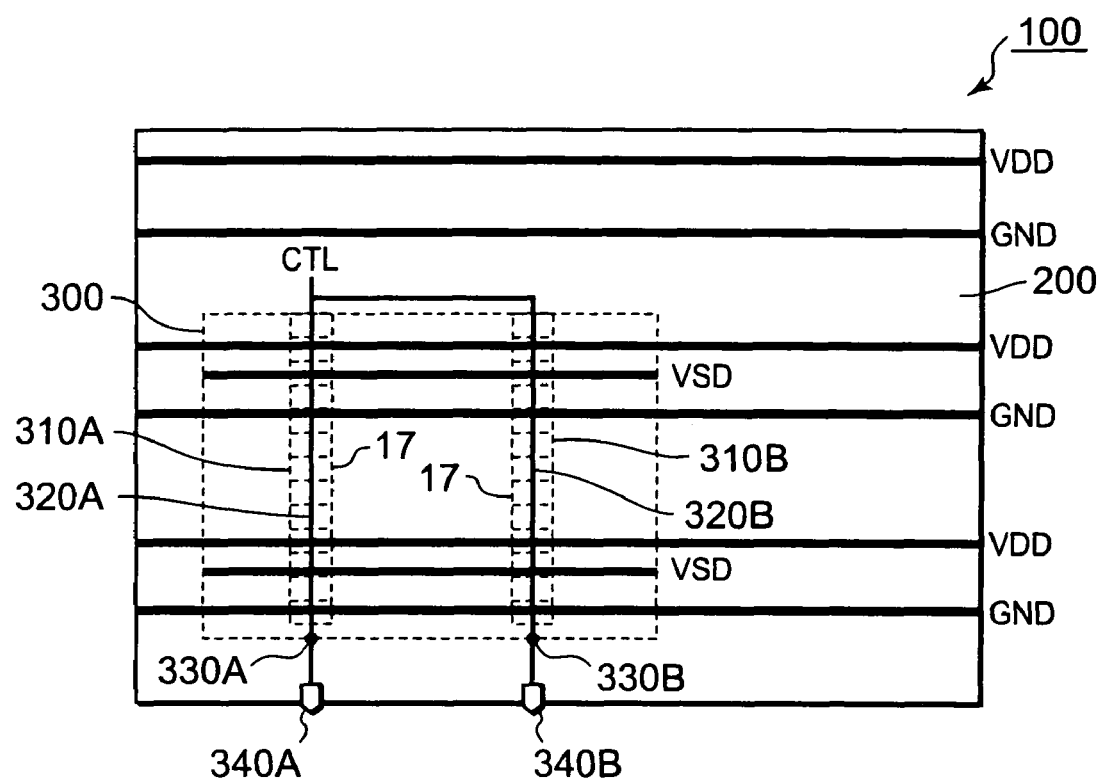
FIG. 1 is a layout diagram of a semiconductor integrated circuit including a power controllable region according to a first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, a description is given of embodiments of the present invention with reference to the drawings as well as reference symbols of respective elements in the drawings.

First Embodiment

A first embodiment of the present invention is described.

FIG. 1 is a layout diagram of a semiconductor integrated circuit including a power controllable region according to the first embodiment.

Referring to FIG. 1, a semiconductor integrated circuit 100 includes an always-on region 200, and a power controllable region 300. Power control switches 310A and 310B are disposed between a power supply VDD and a power supply VSD, and the power control switches 310A and 310B are controlled to be turned on/off according to a power control signal CTL which is input from the outside of the power controllable region 300.

The power control switches 310A and 310B are configured by a plurality of switch series.

Each switch series of the power control switch has switch cells 17 each including the combination of a semiconductor transistor 14 that switches between the power supply VDD and the power supply VSD, and a timing adjustment buffer 15 as described with reference to FIG. 15.

A power control signal line 320 is branched for each of the switch series 310A and 310B of the power control switch, and each of branch lines 320A and 320B is wired inside the power controllable region 300. Then, the switch cells 17 are aligned for each of the branched power control signal lines 320A and 320B to constitute each of the switch series 310A and 310B of the power control switch.

In the first embodiment, there are provided output nodes 330A and 330B and output terminals 340A and 340B for extracting a signal of the control signal line 320 to the outside.

The output nodes 330A and 330B, and the output terminals 340A and 340B are respectively disposed for the branched control signal lines 320A and 320B, that is, for the switch series of the power control switches 310A and 310B.

The output nodes 330A and 330B can output an output of a final stage of the power control switch to the outside of the power controllable region 300 for the switch series of the power control switch.

The output terminals 340A and 340B are connected with lines led out from the output nodes 330A and 330B, respectively.

The output terminals 340A and 340B each output the output of the final stage of the power control switch to the outside of a chip for the switch series of the power control switch.

In the above-mentioned configuration, the operation of the power control switches 310A and 310B can be confirmed. Specifically, the presence or absence of a disconnection of the control signal line is determined as described below.

Figure 15:
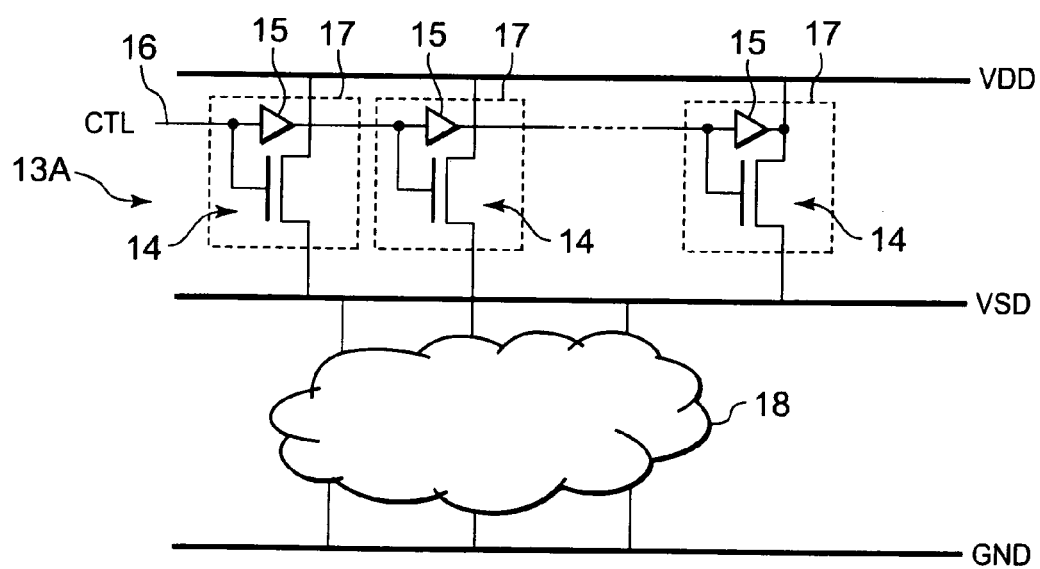
FIG. 15 is a diagram illustrating a configuration of a power control switch.
Figure 16:
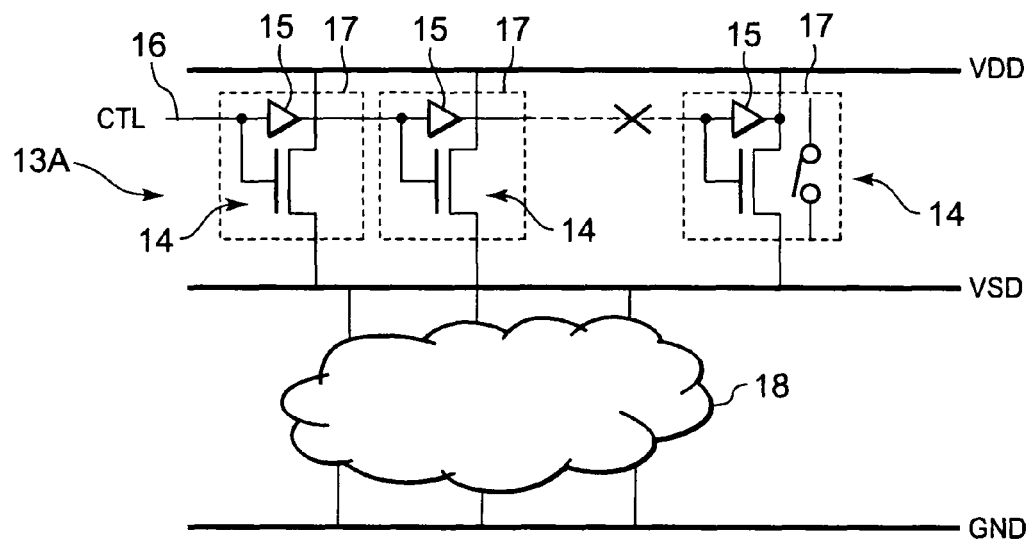
FIG. 16 is a diagram illustrating one example of a defect of the power control switch.
Figure 17:
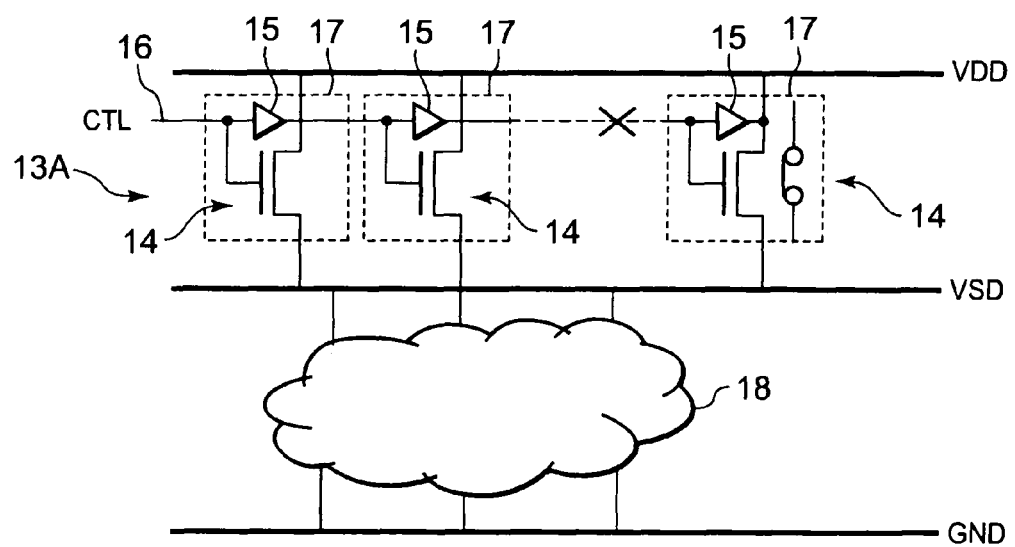
FIG. 17 is a diagram illustrating another example of the defect of the power control switch.

For example, when the control signal lines 320A and 320B are disconnected on the way, a potential of the wiring at the disconnected portion is unstable as can be understood from the description of FIGS. 15 to 17. Therefore, a logical value of that portion is fixed to any one of a high level and a low level depending on the situations of the disconnection. As a result, the switches between the disconnected portion and the output terminal 340A or 340B become in an always-on or always-off state, and never respond to a change in the logical value of the control signal CTL for controlling a connection state of the respective switches. This embodiment utilizes this phenomenon. That is, for example, in the case where a test device is connected to the output terminal 340A to observe the logical value of the output terminal 340A, when the logical value output from the output terminal 340A is changed in response to a change in the logical value of the signal CTL input to the control signal line 320A, no disconnection occurs in the control signal line 340A. On the other hand, in the case where the logical value of the signal CTL input to the control signal line 320A is changed, when the logical value of the signal output from the output terminal 340A is fixed without any change, the control signal line 320A is disconnected at any portion of the signal line. The above description is given of a case in which the presence or absence of the disconnection of the control signal line 320A is determined by the aid of the output terminal 340A. The same is applied to a case in which the presence or absence of the disconnection of the control signal line 320B is determined by the aid of the output terminal 340B. In the conventional art, as described above, it is impossible to separate which factor among a plurality of occurrence factors causes the malfunction of the logic circuit 18, and an increase in the leak current in a given region on the chip, which are caused by the IR drop. However, according to this embodiment, it is possible to determine the presence or absence of the disconnection of the control signal line for controlling each switch. Accordingly, in this embodiment, it is possible to separate whether the malfunction of the logic circuit 18, and an increase in the leak current in the given region due to the IP drop are caused by the disconnection of the control signal line to the switch for controlling the supply of a voltage to the power controllable region 300, or by other factors.

Further, in conducting the operation test, there is an idea that an external output terminal is disposed for each of the semiconductor switch cells 17. However, because the semiconductor switches that constitute the power control switch are large in number, there arises such a problem that the test points are remarkably increased. Therefore, the idea is not realistic.

In view of this, in this embodiment, the output nodes 330A and 330B and the output terminals 340A and 340B may be disposed for the switch series 310A and 310B of the power control switch, respectively, and hence the number of observation points may be remarkably small.

Modified Examples

Figure 2:
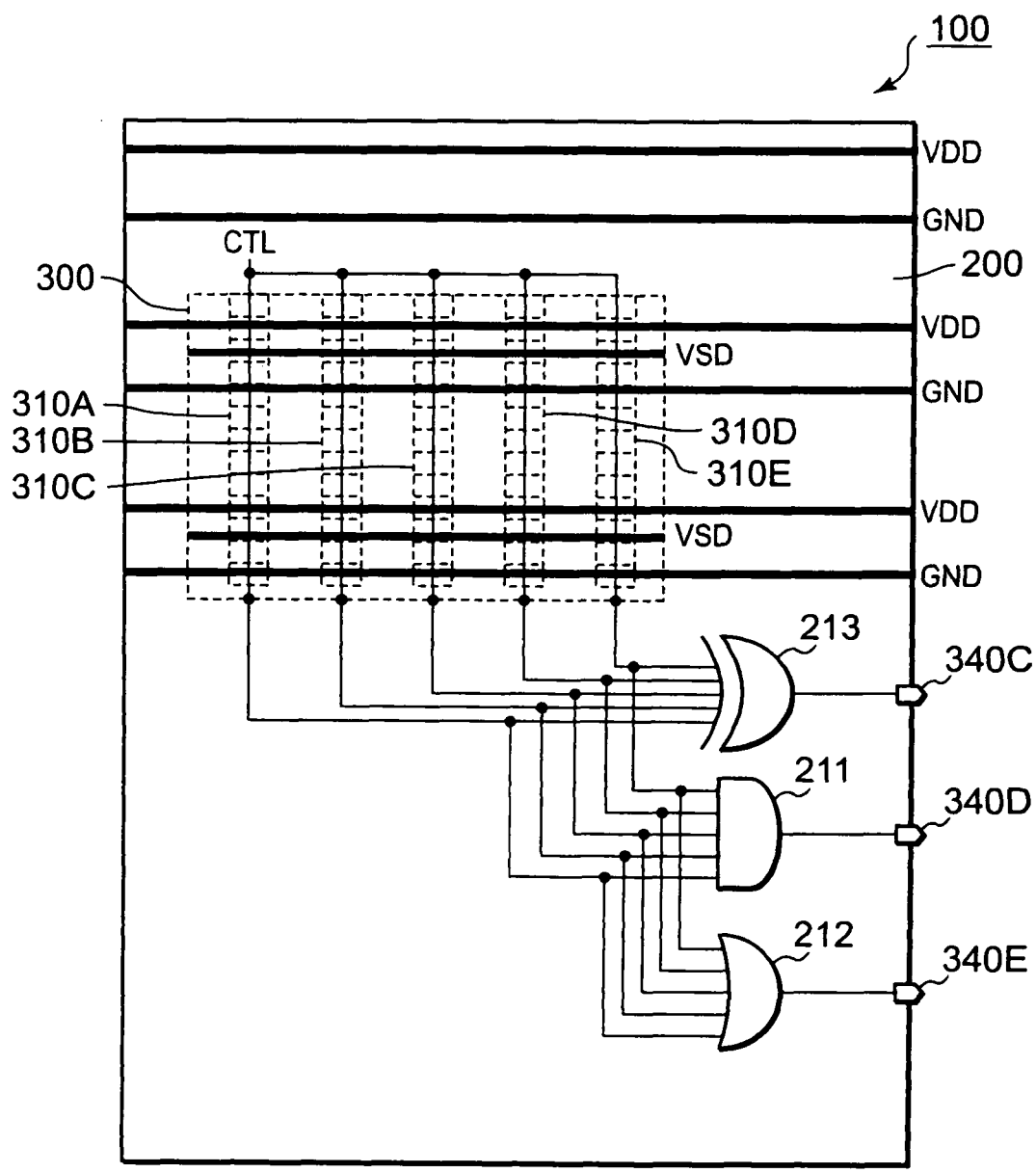
FIG. 2 is a diagram illustrating a modified example 1 of the first embodiment.

As a modified example 1, as illustrated in FIG. 2, a configuration may be made such that signals that have passed through the respective switch series 310A to 310E of the power control switch are input to logic gates 211, 212, and 213 of AND, OR, and XOR, and respective output signals from those logic gates are output to respective output terminals 340C to 340E. The XOR of FIG. 2 is illustrated as an XOR with a plurality of inputs, but in fact, the XOR is configured by multi-stage XORs with two inputs. That is, a case in which all of values indicated by the control signal line are "1" can be tested by the AND gate, and a case in which all of values indicated by the control signal line are "0" can be tested by the OR gate. For example, the signal line is disconnected unless the output of the AND gate is high level in the case where the power control signal CTL is high level. Further, it can be determined that the signal line is disconnected unless the output of the OR gate is low level in the case where the CTL is low level. Further, in the multistage configuration of the XORs with two inputs, the signal line is not disconnected if the signal of low level is output from the XOR both when the CTL is low level and when the CTL is high level. However, it can be determined that the signal line is disconnected if the signal of high level is output from the XOR in a state where the CTL is low or high.

Figure 3:
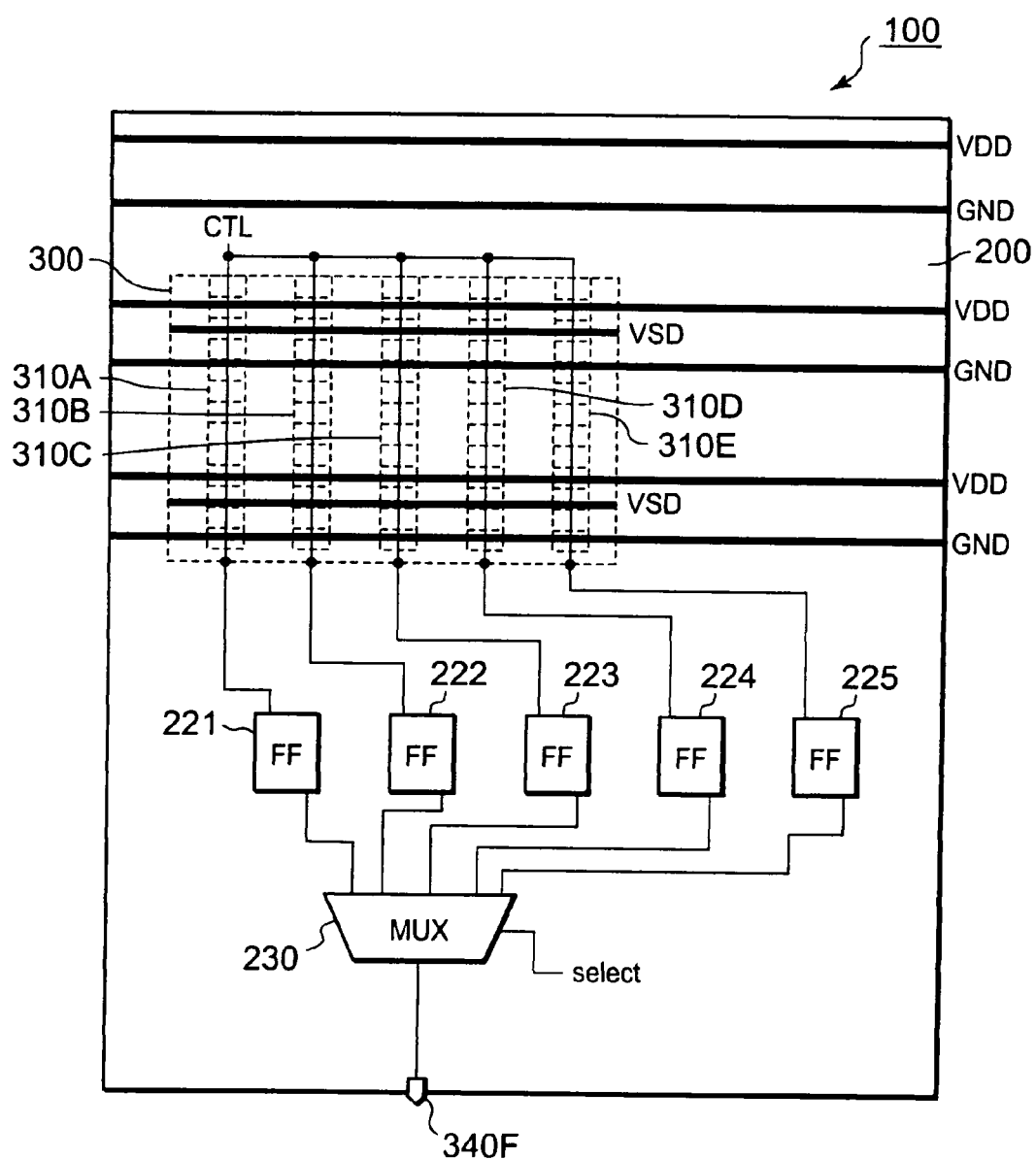
FIG. 3 is a diagram illustrating a modified example 2 of the first embodiment.

Further, as a modified example 2, as illustrated in FIG. 3, a configuration may be made such that signals that have passed through the respective switch series 310A to 310E of the power control switch are input to flip-flops (FF) 221 to 225, respectively, and outputs from those flip-flops are selectively output to an output terminal 340F through a multiplexer 230. In this case, outputs of the respective control signal lines that propagate the CTL are held in the respective FFs 221 to 225 once. Then, a value of a signal "select" to the MUX 230 changes over to output the values held by the respective FFs to the terminal 340F. A configuration may be made such that, without provision of the FF 221 to the FF 225, the output of the MUX 230 changes over based on the value of "select" to output the respective control signal line outputs that propagates the CTL to the outside.

With the above-mentioned configuration, even when the number of switch series of the power control switch is large, the number of observation points can be reduced.

Figure 4:
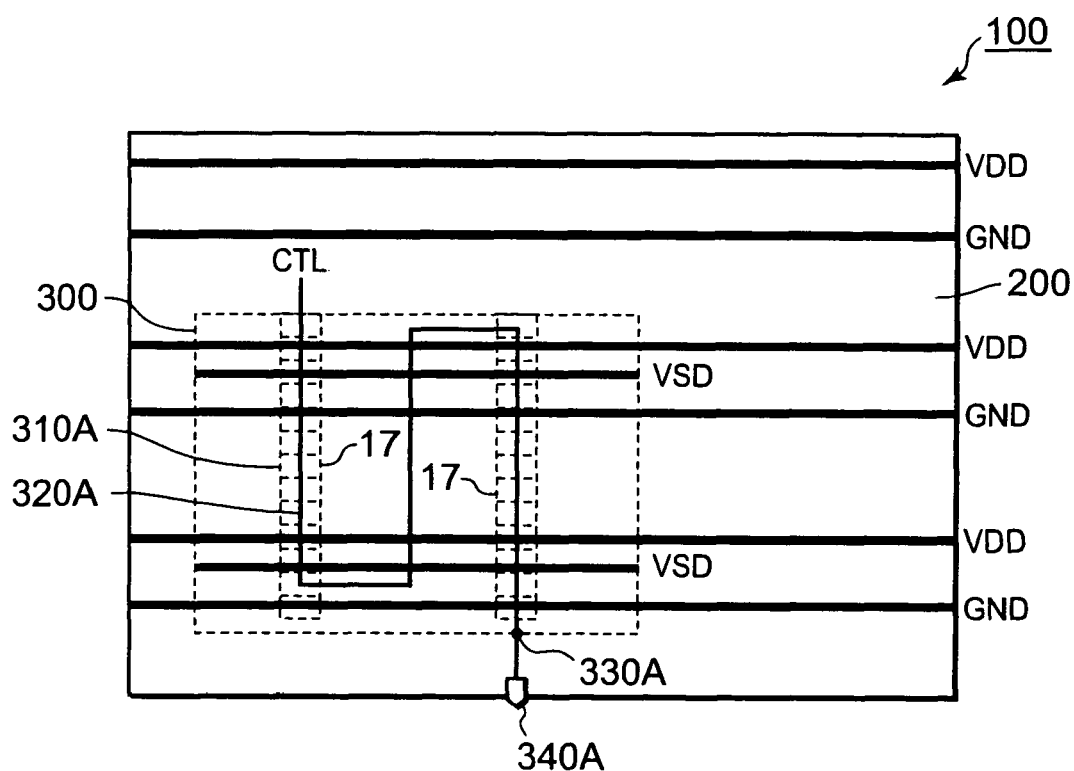
FIG. 4 is a diagram illustrating a modified example 3 of the first embodiment.

Further, as a modified example 3, as illustrated in FIG. 4, a configuration may be made such that the switch series are linked together to constitute the power control switch, thereby reducing the number of output nodes and the number of output terminals.

Second Embodiment

Subsequently, a second embodiment of the present invention is described.

The second embodiment is configured to implement a test of a circuit including a power supply switch by scan test.

Figure 5:
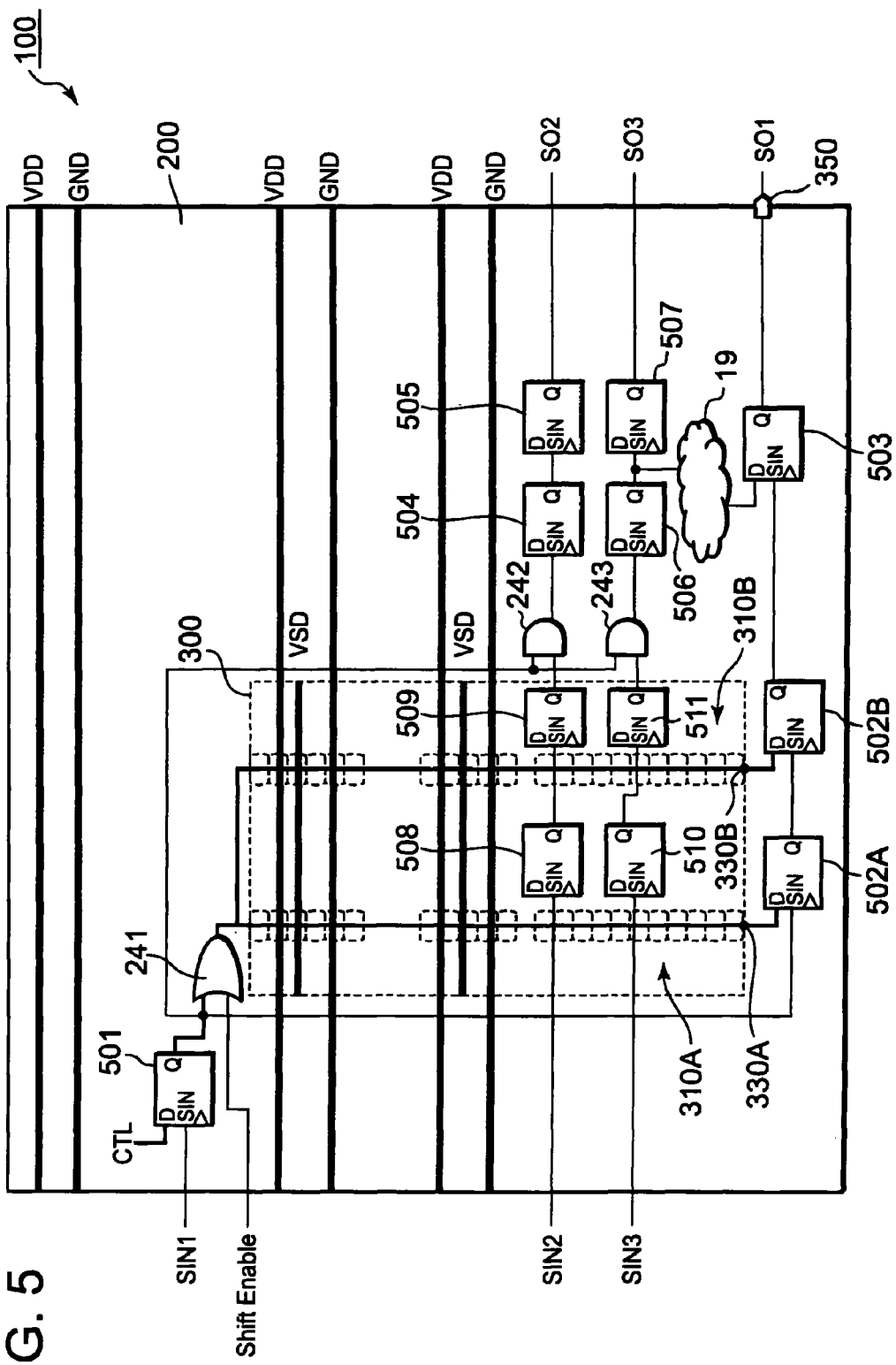
FIG. 5 is a diagram illustrating a second embodiment of the present invention.

FIG. 5 illustrates the second embodiment.

In the second embodiment, in order to conduct a scan path test, a given flip-flop is configured by a scan flip-flop (hereinafter, referred to as "observation FF").

Figure 6:
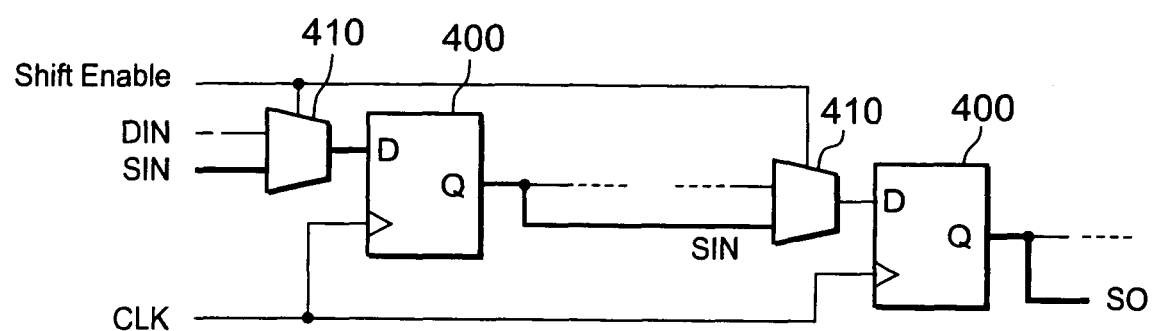
FIG. 6 is a diagram illustrating an observation flip-flop (FF)

As illustrated in FIG. 6, the observation FF is configured by adding a multiplexer 410 to an input of each normal flip-flop 400.

The multiplexer 410 changes over an input signal to a data input pin of the flip-flop 400 between a normal data input (DIN) and a scan-in (SIN).

The multiplexer 410 changes over a normal operation and a test mode according to a signal "Shift Enable", and loads the scan-in (SIN) and supplies the scan-in to a data terminal of the flip-flop in the test mode. Then, the respective flip-flops 400 are connected to each other in such a manner that a scan-out of the flip-flop 400 at a preceding stage becomes a scan-in (SIN) of the flip-flop 400 at a subsequent stage.

As a result, a scan chain of the scan path test is configured.

In FIG. 5, for facilitation of visualization, the multiplexer 410 for the observation FF is omitted, and D and SIN are indicated as the data terminals.

Further, the signal "Shift Enable" is input to the multiplexer of each flip-flop, but in FIG. 5, a wiring of the signal "Shift Enable" is omitted.

Further, a normal data input line in the normal operation of the observation FF is omitted, and wirings of the scan chain is mainly illustrated.

Further, in FIG. 5, only one logic circuit (reference numeral 19) necessary for the normal operation is exemplified, and other circuits are omitted.

Referring to FIG. 5, first, a description is given of the scan chains for testing the respective signal lines for controlling a connection state of the power control switches 310A and 310B.

The scan chains that test the respective signal lines for controlling the connection state of the power control switches 310A and 310B are a line from an SIN1 to an SO1. The scan chain SIN1 is also used to test the operation of the logic circuit connected between a data terminal of the flip-flop (FF) disposed on the SO1 side of the FF 503 and a data terminal of the FF disposed on the SO3 side of the FF 507 located on the SIN3 being another scan chain, for example. This test is a scan path test known as the known technology. That is, the SIN1 is disposed to test the signal line for controlling the connection state of the power control switches 310A and 310B, in addition to testing the operation of the logic circuit disposed in the semiconductor integrated circuit 100.

On the other hand, an SIN2 and an SIN3 being other scan chains different from the SIN1 are also disposed in the semiconductor integrated circuit 100 of FIG. 5. The SIN2 and the SIN3 are scan chains for testing the logic circuit disposed in the always-on region 200, and the logic circuit disposed inside of the power controllable region 300.

Referring to FIG. 5, the SIN3 is used to test the logic circuit 19 disposed in the always-on region 200, and in actuality, also used to test the logic circuit disposed inside of the power controllable region 300. In particular, an FF 508, an FF 509, an FF 510, and an FF 511 are FFs used to test the logic circuits inside of the power controllable region 300. Like the SIN3, the SIN2 is also a scan chain used to test the logic circuits disposed in the always-on region 200 and the power controllable region 300.

In FIG. 5, an observation FF 501 to which the power control signal CTL is input in the normal operation is disposed, and test data SIN1 of the scan path test is input to a scan-in terminal of the observation FF 501 from a scan-in terminal outside of the chip.

A data output of the observation FF 501 is input to the power control switches 310A and 310B through an OR circuit 241.

In this embodiment, the control signal line that propagates the control signal CTL for controlling the connection state of whether the power control switch 310A or 310B is on or off is tested as described below.

First, the control signal "Shift Enable" is activated. For example, the signal "Shift Enable" is set to the high level.

In this case, as described above, the respective FFs included in the SIN1, the SIN2, and the SIN3 load input signals on the SIN side in the respective FFs in response to the signal "Shift Enable" that has become high level. Then, because the signal "Shift Enable" is high level, the logical value of the signal output from the OR circuit 241 is also fixed to the high level.

The OR circuit 241 is connected to the control signal line that propagates the CTL (refer to FIG. 15). That is, because the OR circuit 241 is fixed to the high level, the on/off states of the respective switches for controlling the supply of a power to the power controllable region 300 are also fixed.

In this embodiment, it is assumed that the respective switches are fixed to the on state when the signal "Shift Enable" is high level.

For example, a configuration may be made such that the respective MOS transistors of FIG. 15 are n-type MOS transistors.

In this state, because a voltage is applied to the power controllable region 300, the scan chains of the SIN2 and the SIN3 can operate together with the scan chain of the SIN1.

That is, as a specific example, because a voltage is applied to the FFs 508 to 511 of the SIN2 and the SIN3, the entire SIN2 and SIN3 can be used for the scan path test together with the SIN1.

In this status, a test pattern is supplied to each of the scan chains SIN1, SIN2, and SIN3. That is, each of the SIN1, the SIN2, and the SIN3 forms a shift register in response to the activation of the signal "Shift Enable", and a bit string which forms a test pattern is serially input to each of the SIN1, the SIN2, and the SIN3. Specifically, each of FFs that form the SIN1, the SIN2, and the SIN3 shifts the test pattern, which is serially input, to an FF at the subsequent stage in response to an edge of an input clock signal. The operation allows the test pattern to be set to the respective FFs of the SIN1 to the SIN3. It is assumed in this case that the bit of the test pattern set to the FF 501 in the SIN1 is "1" indicative of the high level. With this setting, at this time, the FF 501 outputs a signal of the high level from a terminal Q side. Further, respective other FFs of the SIN1, the SIN2, and the SIN3 also outputs a signal indicative of the logical value of the set test pattern from each output terminal Q.

With this operation, for example, the FF 506 of the SIN3 outputs a bit indicated by the set test pattern from the terminal Q, and hence the logic circuit 19 conducts arithmetic operation in response to a signal output by the FF 506, and outputs the operation result toward a data terminal D of the FF 503 of the SIN1. Specifically, at this time, a signal output from the logic circuit 19 arrives at an input on a DIN side of the multiplexer 410 in FIG. 6. The same is applied to the respective FFs which are disposed in the SIN1 to the SIN3, and used to test other logic circuits.

Then, the activated signal "Shift Enable" is deactivated. For example, the logical value of the signal "Shift Enable" is set to the low level. With this operation, the logical value of a signal output from the OR circuit 241 is indicative of the logical value per se of a signal output from the FF 501 of the SIN1. As described above, because the bit of the test pattern set in the FF 501 is high level, the output of the OR circuit 241 maintains the high level without being affected by the deactivation of the signal "Shift Enable". The signal output from the OR circuit 241 arrives at terminals D of an FF 502A and an FF 502B being observation FFs. Specifically, the output signal of the OR circuit 241 arrives at an input on a DIN side of the multiplexer illustrated in FIG. 6. After the output signal of the OR circuit 241 has arrived at the FF 502A and the FF 502B, an edge (for example, rising edge) of a clock signal is supplied to the respective FFs of the SIN1 to the SIN3. With this operation, the respective FFs of the SIN1 to the SIN3 hold the logical value of the signal that has arrived at the terminal D (specifically, DIN of FIG. 6), and output the logical value from the terminal Q. In particular, the FF 502A and the FF 502B hold the signal output from the OR circuit 241, and output the signal from the terminal Q. Further, the FF 501 holds the control signal CTL, and outputs the signal from the terminal Q. In this example, it is assumed that the CTL is high level, and the FF 501 holds the logical value of the high level, and outputs the logical value from the terminal Q. With this operation, the output of the OR circuit 241 is continuously high level. The CTL may be input from the outside of the semiconductor integrated circuit 100, or output from an internal logic circuit.

Thereafter, the signal "Shift Enable" is again activated, and the respective FFs of the SIN1 to the SIN3 are connected in series with each other to form a shift register. Then, a clock is supplied to each FF to output data captured by each FF from the SO1, the SO2, and the SO3. The data output from the SO1 to the SO3 is loaded into a test device (not shown), and examined.

When the control signal lines for connecting the OR circuit 241 and the FF 502A as well as the FF 502B, that is, the signal lines that propagate the CTL for controlling the on/off states of the respective switches (refer to FIG. 15) which are disposed in the power controllable region 300 are not disconnected, the logical value of the signal output from the OR circuit 241 is properly held in the FF 502A and the FF 502B. However, for example, when the signal line on the FF 502A side is disconnected, a fixed logical value is input to the terminal D of the FF 502A regardless of the logical value of the signal output from the OR circuit 241. Likewise, when the signal line on the FF 502B side is disconnected, a fixed logical value is input to the terminal D of the FF 502B. Accordingly, in order to discriminate the presence or absence of the disconnection of the signal line, the scan path test needs to be again conducted.

In the above description, the test pattern set in the FF 501 is a bit "1" indicative of the high level, and the logical value of the CTL captured by the FF 501 is also high level. In this case, the output of the OR circuit 241 continues to be high level even after the signal "Shift Enable" has been deactivated. For that reason, except for a specific case in which the control signal line between the OR circuit 241 and one switch closest to the OR circuit 241 among the respective switches in the power controllable region 300 is disconnected, and for all of the respective switches become always-off, a power essentially continues to be supplied to the power controllable region 300. As a result, because the FF 508 to the FF 511 continue to be driven, it is possible to conduct the scan path test using the FF 508 to the FF 511. Specifically, the logical values captured by the FF 508 to the FF 511 can be directly loaded into the test device from the SO2 and the SO3, and used for examination. Accordingly, a signal of the high level being identical with the level of the output of the OR circuit 241 is input to the AND gates 242 and 243. Then, the values captured by the FF 508 and the FF 509, and the values captured by the FF 510 and the FF 511 are directly output from the AND gates 242 and 243, respectively.

As described above, in order to discriminate the presence or absence of the disconnection of the control signal line, the scan path test needs to be again conducted. Normally, in order to test the logic circuit, the test patterns are set to the respective FFs of the scan chain a plurality of times to conduct the scan path test. Therefore, the signal line that propagates the CTL is also tested together with the scan path test of the logic circuit.

Like the above description, the signal "Shift Enable" is first activated. For example, the signal "Shift Enable" is set to the high level. Referring to FIG. 5, each FF forms a shift register to form the scan chains SINl1 to SIN3. In this state, the test pattern is supplied to the respective SIN1 to SIN3. In the supply of the test pattern at this time, the bit of the test pattern set to the FF 501 is set to the bit "0" indicative of the low level. As a result, the FF 501 outputs a signal indicative of the low level from the terminal Q.

Like the above description, the signal "Shift Enable" is deactivated so that the output of the OR circuit 241 is indicative of the output signal from the FF 501. At this time, a signal output from the OR circuit 241 is indicative of a logical value of the low level. Then, after the signal output from the OR circuit 241 has arrived at the FF 502A and the FF 502B, an edge of the clock signal is supplied to the respective FFs of the SIN1 to the SIN3. Like the above description, in response to the edge of the clock, the respective FFs hold the values of the signals that have arrived at the respective terminals D, and output the signals from the respective terminals Q. In particular, the observation FF 502A and the observation FF 502B hold the value of the signal output from the OR circuit 241 (unless the control signal line that propagates the CTL is disconnected). Further, the FF 501 holds the logical value of the signal CTL. In this situation, the logical value of the signal CTL held in the FF 501 is set to the low level.

Then, when the signal "Shift Enable" is again activated, each FF disposed in the respective SIN1 to SIN3 forms a shift register, and outputs the held value to the SO1 to the SO3 in response to a clock signal. Those output values are loaded into the test device, and examined.

The test pattern set in the FF 501 is "0" indicative of the low level. Unless the control signal line that propagates the CTL is disconnected, values captured by the FF 502A and the FF 502B are also "0". However, when the signal line that connects the FF 502A and the OR circuit 241 is disconnected, a value of the signal captured by the FF 502A is indicative of the same value as that in the scan path test when "1" indicative of the high level is set to the FF 501 at the previous time. Likewise, when the signal line that connects the FF 502B and the OR circuit 241 is disconnected, a value of the signal captured by the FF 502B is indicative of the same value as that in the scan path test when "1" indicative of the high level is set to the FF 501.

That is, it can be discriminated whether or not the control signal line that propagates the signal CTL is disconnected, by execution of the above-mentioned two scan path tests. In the above-mentioned second scan path test, a power is not supplied to the FF 508 to the FF 511 on the way. This is because a bit "0" indicative of the low level is set to the FF 501 as the test pattern. Accordingly, the values captured by the FF 508 to the FF 511 in the second scan path test should not be used for examination. This is because, due to the fact that the supply of a power to the FF 508 to the FF 511 stops in response to the deactivation of the signal "Shift Enable" after the test pattern has been set to the FF 508 to the FF 511, the values of the signals output from the terminals Q by the FF 508 to the FF 511 in response to the subsequent activation of the signal "Shift Enable" are unfixed values. For that reason, a value of the signal CTL captured by the FF 501 is low level, and the signals output from the AND gate 242 and the AND gate 243 are fixed to the low level. That is, the AND gates 242 and 243 serve as mask circuits that prevent data output from the FF 508 to the FF 511 inside of the power controllable region 300 from being output to the SO2 to the SO3.

In this embodiment, an FF for testing the control signal line that propagates the CTL is disposed in the scan chain for examining the logic circuit disposed in the semiconductor integrated circuit 100. With this arrangement, as described above, because the disconnection of the control signal that propagates the CTL can be examined together with the scan path test of the logic circuit to be examined, the examination may be performed more efficiently.

Further, in the first embodiment, the value of the signal from the control signal line that propagates the CTL needs to be output directly to an external terminal. The use of the external terminal for test leads to an increase in the number of pins, which is not always preferable. On the other hand, in the second embodiment, the test result of the control signal line can be output to the outside through not the external terminal but the scan chain. As a result, the presence or absence of the disconnection of the control signal line can be specified without an increase in the number of pins. Further, it can be specified without an increase in the number of pins whether a factor in the malfunction of the circuit, an increase in the leak current, or the like, is caused by the disconnection of the control signal line, or other factors.

The observation FFs 501, 502A, 502B, and 503 which constitute the scan chain for testing the signal line that propagates the CTL are required to operate with the power supply VDD irrelevant to the operation of the power control switches 310A and 310B. Therefore, FIG. 5 exemplifies a case in which the observation FFs are arranged outside of the power controllable region 300. Alternatively, if wiring is made such that the observation FF operates with the power supply VDD, the observation FF may be arranged in the power controllable region 300.

Further, in the supply of the test pattern for execution of the scan path test, the signal "Shift Enable" is activated, and the signal "Shift Enable" is supplied to the power control switches 310A and 310B through the OR circuit 241.

As a result, the output of the OR circuit 241 is fixed to the high level not depending on a bit string indicative of the test pattern, and hence the power control switches 310A and 310B can be turned on without flip-flopping.

Third Embodiment

Subsequently, a third embodiment of the present invention is described.

The third embodiment is configured to test a state of the signal line that propagates the signal CTL for controlling the on/off state of the power control switch, and to test other logic circuits, separately.

In the third embodiment, as compared with the second embodiment, there are three advantages that the creation of the test patterns that are input to the scan chains is facilitated, the test time is reduced, and the test patterns are automatically created by the aid of a tool. Reasons for obtaining those advantages are described later.

Hereinafter, in the third embodiment, how to test is described sequentially with reference to FIGS. 7 and 8.

First, it is tested whether or not the signal line that propagates the control signal CTL is disconnected.

Figure 7:
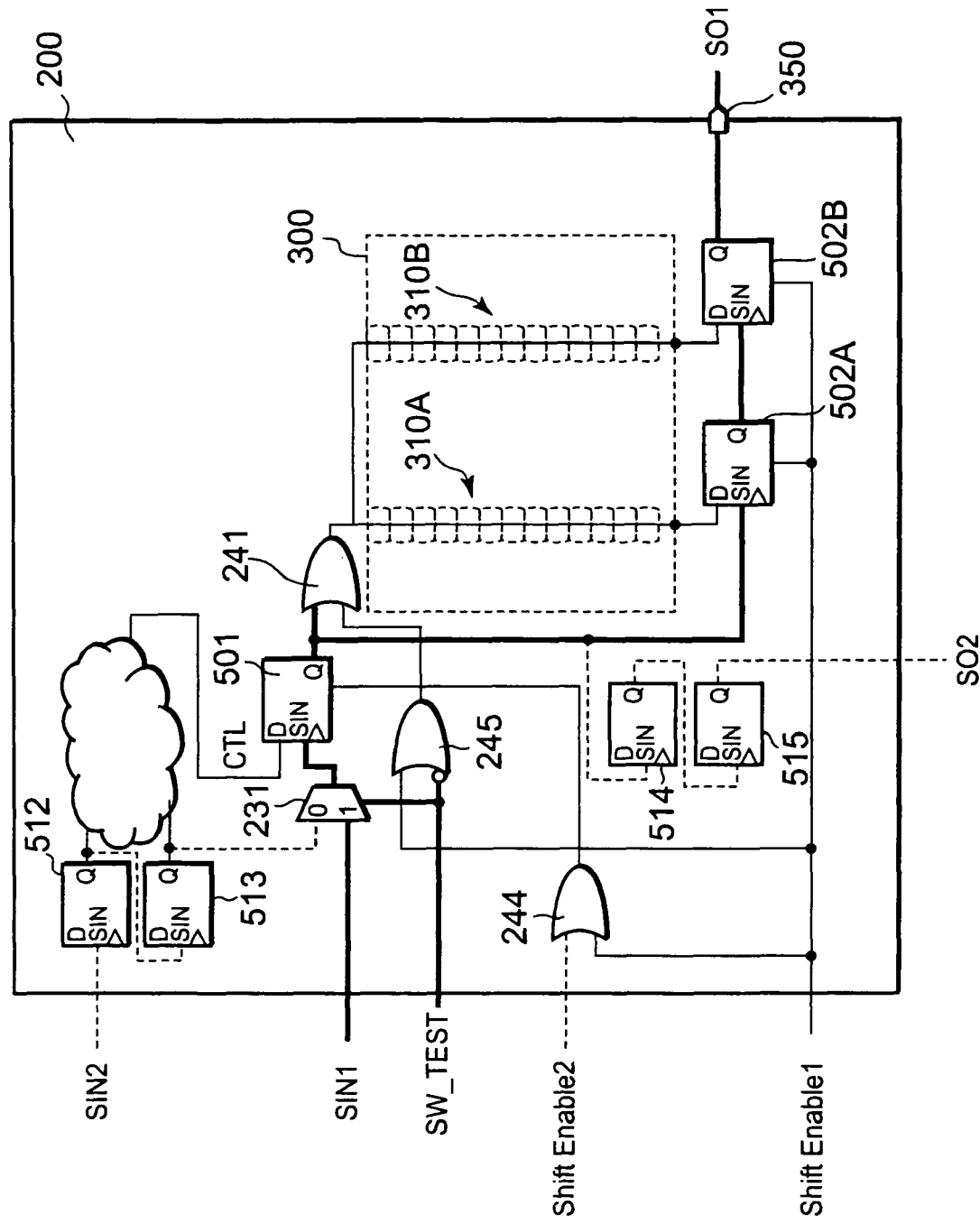
FIG. 7 is a diagram illustrating a state in which a test of a power control switch is conducted in a third embodiment of the present invention.

Referring to FIG. 7, the signal "Shift Enable 1" is first activated. For example, the signal "Shift Enable 1" is set to the high level. In this embodiment, the signal "Shift Enable 1" is input to the FF 501, the FF 502A, and the FF 502B. Further, the signal "Shift Enable 2" is deactivated, and a signal "SW_TEST" is activated and becomes high level.

Because the signal "Shift Enable 1" becomes high level, the output of an OR circuit 244 becomes high level, and the FF 501, the FF 502A, and the FF 502B form shift registers to provide the scan chain SIN1 as described in the second embodiment.

A selector 231 outputs a signal input to the SIN1 to the FF 501 because the signal "SW_TEST" is high level.

Further, because the output of an OR circuit 245 is also high level, the output of the OR circuit 241 becomes high level, and the power controllable region 300 is fixed in a state where a power is supplied thereto.

Subsequently, the test pattern is input to the SIN1.

In this case, the test pattern is created taking only the test pattern that is input to the FF 501 for testing the signal line that propagates the control signal CTL into consideration.

There is no need to set the test pattern to the FFs 502A and 502B. After the test pattern has been set to the FF 501, as in the second embodiment, the signal "Shift Enable 1" is deactivated, for example, set to the low level. It is assumed that the test pattern set to the FF 501 is "1" indicative of the high level. In this embodiment, in the scan path test using the SIN1, the logic circuit disposed inside of the power controllable region 300 is not tested. The logic circuit concerned is tested in execution of the scan path test using another scan chain SIN2 to be described later. Accordingly, even if the test pattern set to the FF 501 is "1" or "0", the subsequent test is not affected by this test pattern unlike the second embodiment. However, in this example, it is assumed that "1" is set to the FF 501.

Thereafter, the signal "Shift Enable 1" is deactivated, and the respective FFs included in the SIN1 hold data that has arrived at the data terminals D, and output the data from the terminals Q, as described in detail in the second embodiment. In this situation, the FFs 502A and 502B hold the logical value of the signal output from the OR circuit 241, and output the signal from the terminals Q (unless the signal line is disconnected) as in the second embodiment.

Because the test pattern set to the FF 501 is "1", the output of the OR circuit 241 remains high level in deactivation of the signal "Shift Enable 1". However, the output of the OR circuit 241 when the respective FFs included in the SIN1 hold data that has thereafter arrived at the terminals D changes depending on whether the logical value of the signal CTL is high level or low level. However, as described above, because the logic circuit inside of the power controllable region 300 is not tested in the scan path test using the SIN1, this will not be discussed.

Subsequently, the signal "Shift Enable 1" is again activated, and the respective FFs included in the SIN1 form the shift registers. A clock is supplied to the respective FFs of the SIN1, and the values of the signals held by the respective FFs are output from the terminal SO1. The value output from the SO1 is loaded in the test device, and examined.

The values of the signals output to the SO1 from the FF 502A and the FF 502B are data output from the OR circuit 241 unless the signal line that propagates the control signal CTL is disconnected. On the contrary, when the signal line is disconnected, the values are merely a fixed logical value generated by disconnection. Accordingly, the above-mentioned scan path test needs to be again conducted as in the second embodiment.

In the subsequent scan path test, the test pattern set to the FF 501 may be set to "0" indicative of the low level.

As a result, the processing is advanced in the same manner as that described above, and the test result is acquired from the SO1.

As a result, when the signal value output to the SO1 by the FF 502A changes between the first time and the second time, the control signal line that connects the OR circuit 241 and the FF 502A is not disconnected. On the other hand, when the signal value output to the SO1 by the FF 502A is a fixed logical value without a change between the first time and the second time, the control signal line that connects the OR circuit 241 and the FF 502A is disconnected. The same determination can be made on the signal line that connects the FF 502B and the OR circuit 241.

With the above-mentioned operation, it can be discriminated whether or not the signal line that propagates the control signal CTL is disconnected.

Subsequently, the logic circuit disposed on the semiconductor integrated circuit is tested. For the testing, in this embodiment, the scan chain SIN2 disposed separately from the SIN1 is used.

Figure 8:
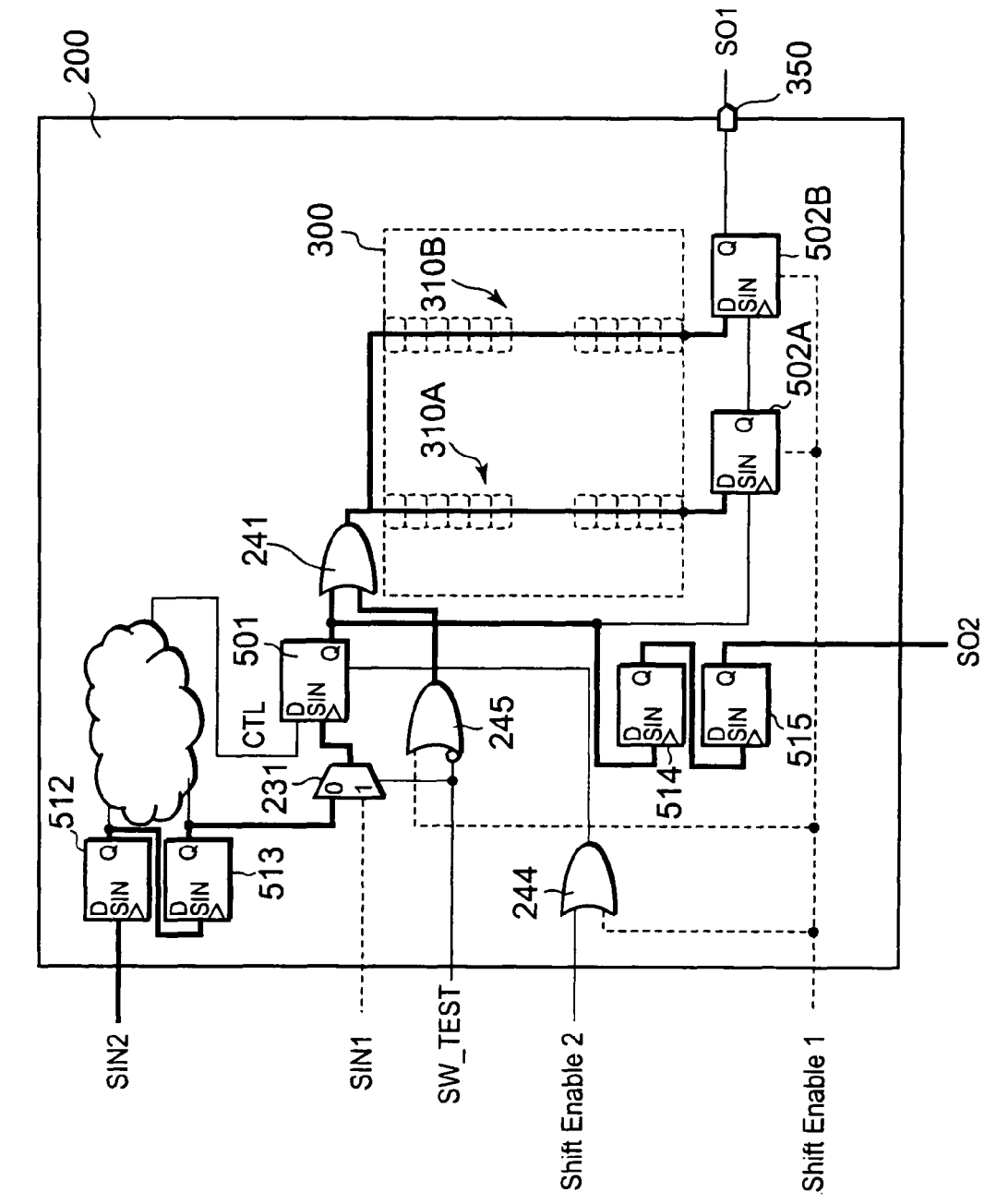
FIG. 8 is a diagram illustrating a state in which a logic test of a circuit other than the power control switch is conducted in the third embodiment.

The SIN2 is provided in only the region 200 to which a power is always supplied in FIGS. 7 and 8. However, in actuality, the SIN2 is also provided in the power controllable region 300, and is used also to test the logic circuit disposed inside of the power controllable region 300.

Referring to FIG. 8, the signal "Shift Enable 2" is first activated. For example, the signal is set to the high level.

Then, the signal "SW_TEST" is deactivated, for example, fixed to the low level. The signal "Shift Enable 1" remains deactivated. In response to the activation of the signal "Shift Enable 2", the FF 501, the FF 512 to the FF 515 form the shift registers to provide the scan chain SIN2.

The selector 231 outputs, to the FF 501, data output from the terminal Q of the FF 513 with deactivation of the signal "SW_TEST". In the case of using the SIN2, because the output of the OR circuit 245 becomes high level by deactivating the signal "SW_TEST", the output of the OR circuit 241 becomes also high level. That is, the power controllable region 300 is fixed to the on state where a voltage is applied thereto.

Though not illustrated in FIG. 8, the SIN2 is also provided inside of the power controllable region 300.

That is, the logic circuit disposed inside of the power controllable region 300 is also tested by using the SIN2 in parallel. This is because, due to the fact that the power controllable region 300 is fixed to the on state when the signal "SW_TEST" is deactivated, the voltage supply to the respective FFs which constitute the scan chain disposed inside of the power controllable region 300 is not blocked. That is, in this event, there is no case in which the test result output by the FFs included in the SIN2 inside of the power controllable region 300 is such an unfixed value as in the second embodiment. Therefore, a reliable examination can be conducted even if the logic circuits inside of the always-on region and the power controllable region 300 are tested together.

The following processing is identical with the above description. That is, because the signal "Shift Enable 2" is activated, the test pattern is set to the respective FFs of the SIN2. Then, the signal "Shift Enable 2" is deactivated, and the respective FFs of the SIN2 capture data that has arrived at the terminals D. Thereafter, the signal "Shift Enable 2" is again activated, and the test result of the logic circuit is output from the SO2. Then, the output result is examined.

In the third embodiment, the scan path test for discriminating the disconnection of the signal line that propagates the control signal CTL, and the scan path test for testing the logic circuit are conducted, separately. As a result, the test patterns can be dividedly created into a pattern for testing the signal line and a pattern for testing the logic circuit. In the second embodiment, because the disconnection of the signal line and the test of the logic circuit are conducted at the same time, the creation of complicated test patterns is required. In this viewpoint, the third embodiment is advantageous.

Further, in the third embodiment, the creation of the test pattern can be conducted by an automatic creation tool. The tool for creating the test pattern cannot create the test pattern taking a fact that the supply of a power to the power controllable region 300 stops into consideration. In other words, the tool creates the test pattern assuming that all of the power supplies are always-on. In the second embodiment, there is a case in which the supply of a power to the power controllable region 300 stops on the way due to the value of the test pattern set to the FF 501 of FIG. 5, or the value of CTL which determines the value captured by the FF 501. The power control signal CTL may be fixed to the high level when the CTL is an external input in the second embodiment, and therefore there arises no severe problem. However, in particular, when the CTL is output by a given logic circuit as illustrated in FIGS. 7 and 8, there is a need to examine the CTL being the output of the logic circuit by various test patterns, and a case in which the CTL becomes low level frequently occurs. As a result, in the second embodiment illustrated in FIG. 5, in testing the logic circuit after testing the signal line that propagates the CTL, there frequently occurs a case in which the power controllable region 300 becomes off when the respective FFs conduct capture (note that the signal "Shift Enable" is inactive). In such a circumstance, when an attempt is made to create the test pattern of the scan path test, the automatic creation tool cannot be used. Accordingly, in the second embodiment, the creation of the test pattern must be manually conducted. In this viewpoint, in the third embodiment, when the logic circuit is tested, the power is always supplied to the power controllable region 300. That is, in this event, the test pattern can be created by the automatic creation tool. Accordingly, the third embodiment exhibits an advantageous effect that the development period is remarkably reduced as compared with the second embodiment.

Further, the third embodiment exhibits an advantage that the test time is reduced as compared with the second embodiment. In the second embodiment, as described above, when the CTL is an output of the logic circuit, there frequently occurs a case in which the supply of a power to the power controllable region 300 stops in the scan path test, and thereafter restarts. When the power supply stops during the scan path test, and thereafter the power supply starts, there is a restriction of waiting for the respective. FFs of the scan chain to capture the values that have arrived at the terminals D until a value of the voltage applied by the power supply is stabilized. On the other hand, in the third embodiment, the test of the disconnection of the signal line and the test of the logic circuit are conducted separately. In the test of the logic circuit, because the supply of a power thereto does not stop, the above-mentioned restriction does not occur. A time necessary for the scan path test of the logic circuit is reduced correspondingly.

The third embodiment has been described above. Alternatively, for example, the scan path test for examining the presence or absence of the disconnection of the signal line may be conducted after the scan path test of the logic circuit has been conducted.

Fourth Embodiment

Subsequently, a description is given of a method of designing a semiconductor integrated circuit including the test circuit of the power control switch described in the second embodiment and the third embodiment.

First, a conventional designing method and its problem are described.

Figure 9:
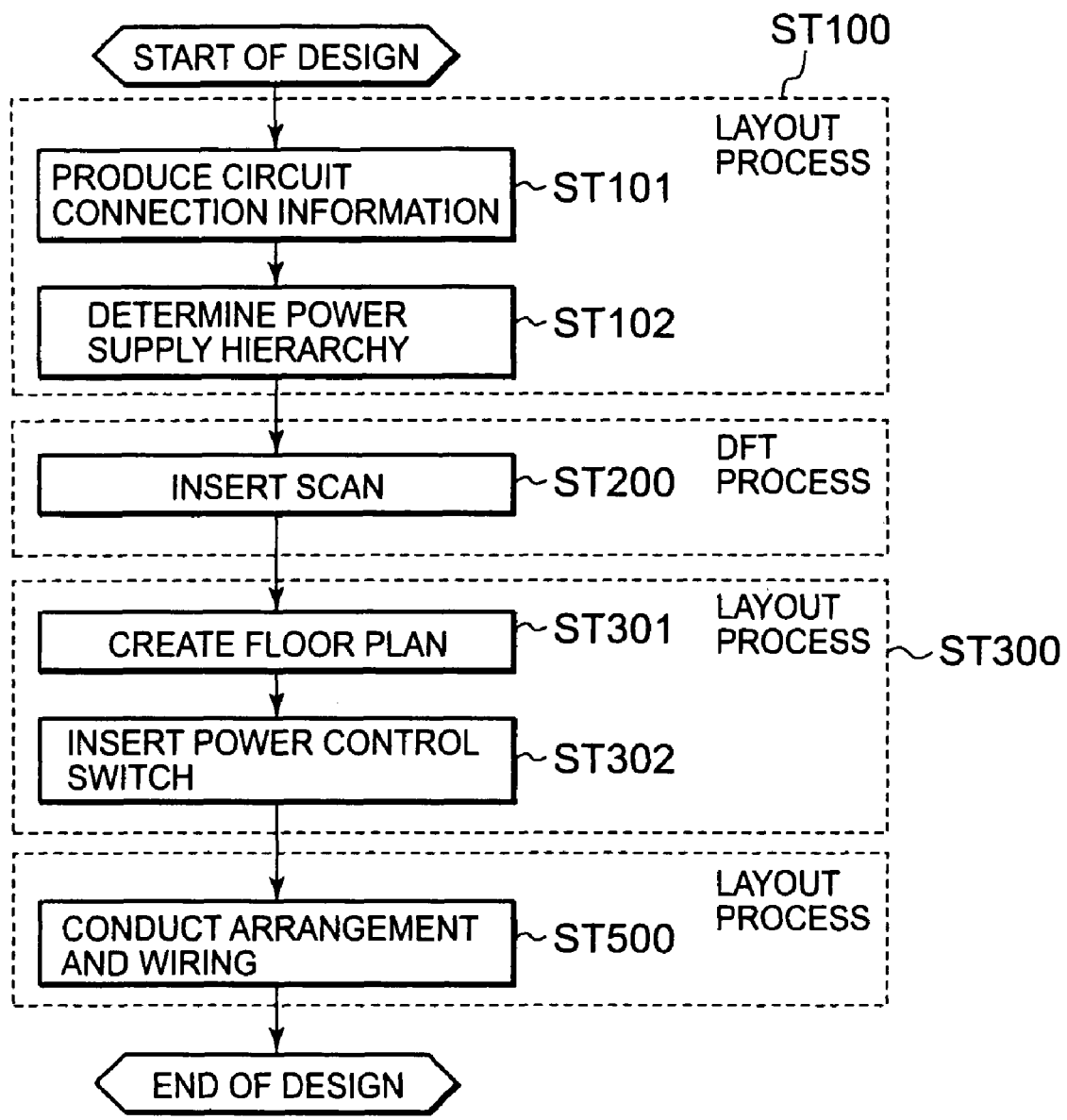
FIG. 9 is a diagram illustrating a procedure of a conventional designing method.
Figure 11:
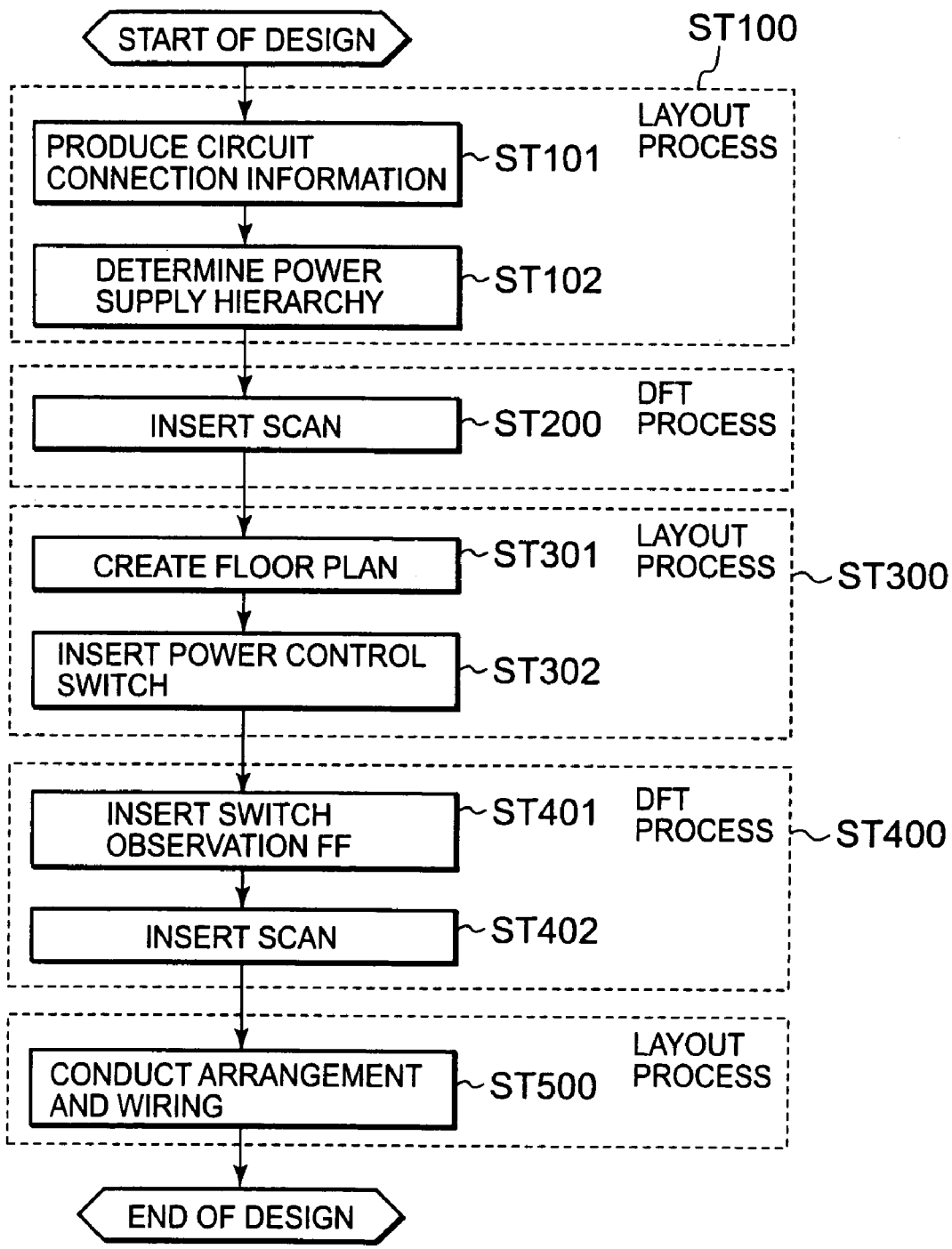
FIG. 11 is a diagram illustrating a procedure of a conventional designing method.

FIGS. 9 and 11 are diagrams illustrating a procedure of the conventional designing method.

FIG. 9 is a flowchart illustrating a procedure of the designing method in the case where the scan test of the power control switch is not inserted in the semiconductor integrated circuit including the power control switch.

Referring to FIG. 9, a description is given of the designing procedure in the case where the scan test of the power control switch is not inserted in the semiconductor integrated circuit including the power control switch.

First, as a layout process (ST100), circuit connection information is produced (ST101), and a power supply hierarchy is also determined (ST102).

Figure 10:
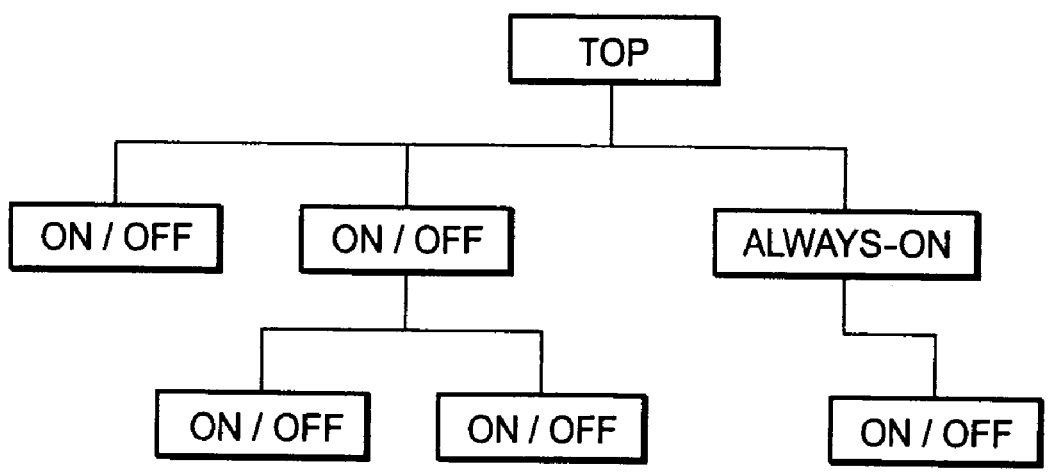
FIG. 10 is a diagram illustrating a power supply hierarchy.

In the determination of the power supply hierarchy (ST102), for example, as illustrated in FIG. 10, a circuit block corresponding to an always-on region and a circuit block corresponding to a power controllable region are separated from each other.

Subsequently, as a design for testability (DFT) process, a scan path is inserted.

In this example, because the power control switch is not tested, the flip-flop inside of the circuit is substituted with a scan FF to configure a scan chain as in the conventional art.

Then, as a layout process (ST300), a floor plan is created (ST301), and a power control switch is also inserted (ST302).

Finally, arrangement and wiring are conducted (ST500).

In the semiconductor integrated circuit including the power control switch as described above, a normal DFT process is conducted only once when the scan test of the power control switch is not inserted, which enables a smooth design.

However, because the scan test of the power control switch is not inserted, even when a resultant product is defective, it is difficult to specify the cause.

FIG. 11 is a diagram illustrating a designing procedure in the case where the scan test of the power control switch is inserted in the semiconductor integrated circuit including the power control switch.

In this case, the layout process (ST100), the scan insertion (ST200), and the layout process (ST300) are identical with the processes described with reference to FIG. 9.

For the purpose of inserting the scan path of the power control switch, after the power control switch has been inserted (ST302), a DFT process (ST400) is again conducted.

Specifically, the switch observation FF is inserted (ST401), and the scan path including the switch observation FF is inserted (ST402).

Finally, as the layout process, arrangement and wiring are conducted (ST500).

With this procedure, the scan for the power control switch is inserted.

However, because the DFT process is conducted twice, the number of data exchanges between the DFT process and the layout process is increased, and trouble and time necessary for a circuit design are remarkably increased.

Further, the layout process is conducted while correcting the floor plan several times so that the final arrangement and wiring become optimum.

As a result, the DFT process (ST400) for the power control switch must be also repeated every time the floor plan is corrected.

For that reason, a significant increase in the processes is required to insert the scan for the power control switch.

On the contrary, a circuit designing method according to a fourth embodiment of the present invention is described.

Figure 12:
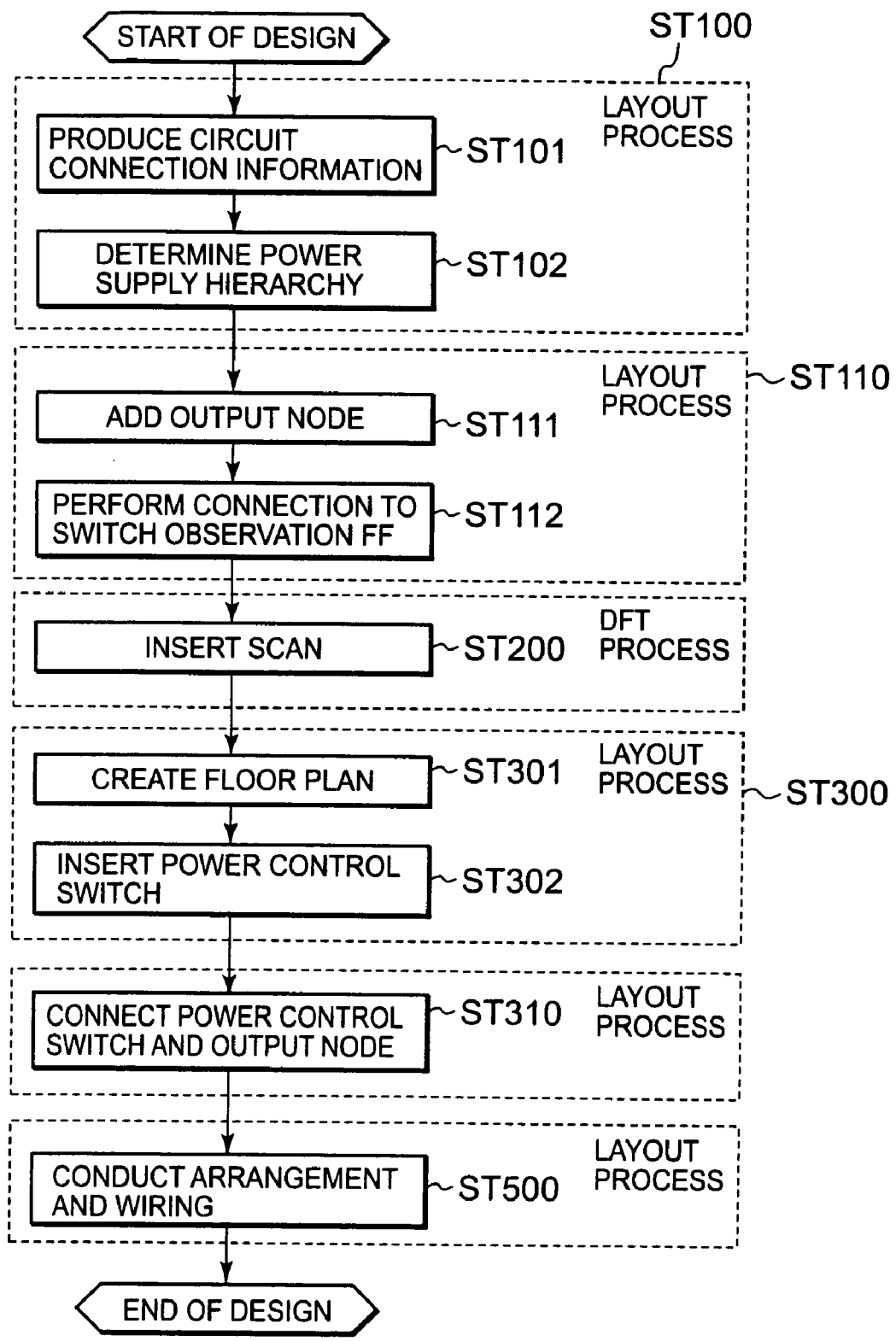
FIG. 12 is a diagram illustrating a designing procedure for inserting a scan test of a power control switch in a fourth embodiment of the present invention.

FIG. 12 is a diagram illustrating a designing procedure in the case where the scan test of the power control switch is inserted in the semiconductor integrated circuit including the power control switch.

Referring to FIG. 12, after the power supply hierarchy has been determined as the layout process (ST100), an output node is added to the power controllable region (ST111) before the scan insertion (ST200) due to the DFT process is conducted, and further the switch observation FF is inserted to perform a connection to the output node.

Figure 13:
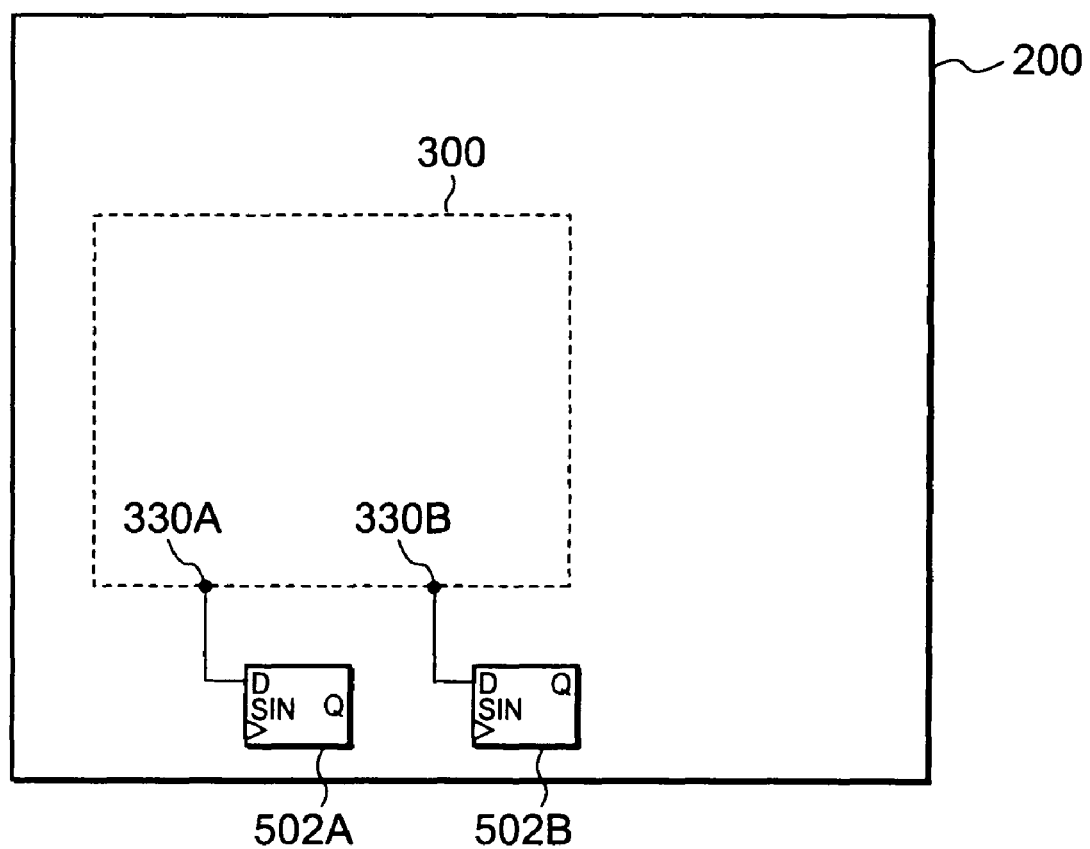
FIG. 13 is a diagram illustrating a state in which an output node is added, and a switch observation FF is inserted in the fourth embodiment.
Figure 14:
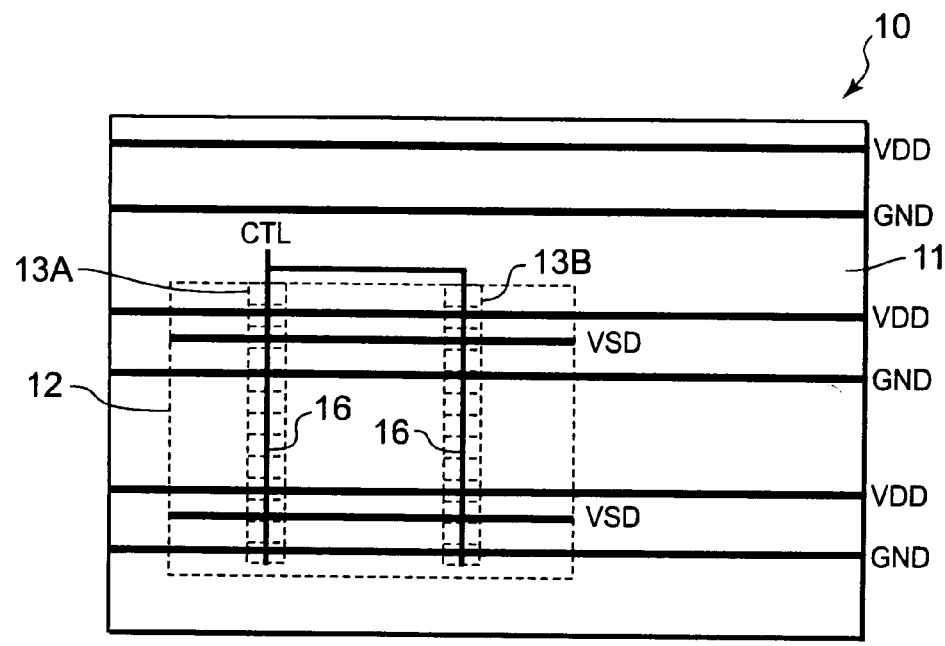
FIG. 14 is a layout diagram of a semiconductor integrated circuit including a power controllable region in the related art.

Specifically, as illustrated in FIG. 13, the output nodes 330A and 330B are added to the power controllable region 300, and the switch observation FFs 502A and 502B are inserted to perform a connection to the output nodes 330A and 330B.

Then, as the normal DFT process, the scan insertion (ST200) is conducted.

As the layout process (ST300), after the floor plan creation (ST301) and the power control switch insertion (ST302) have been conducted, the final stage of the power control switch is connected to the output node (ST310).

As a result, a circuit enabling the test of the power control switch is obtained.

Finally, arrangement and wiring are conducted (ST500).

With the above-mentioned procedure, the DFT process (ST200) is completed at once.

Further, because the output node and the switch observation FF are inserted before the DFT process (ST200), the DFT process (ST200) is conducted in substantially the same manner as that of the normal scan insertion, and hence the circuit design can be facilitated.

The designing method according to the fourth embodiment may be made such that a layout program of the semiconductor integrated circuit is executed by a computer having a CPU and a memory, and the above-mentioned respective processes are executed by the automatic processing.

The present invention is not limited to only the above-mentioned embodiments, and can be variously changed without departing from the gist of the present invention. It is apparent that the present invention is not limited to the above embodiments, but may be modified and changed without departing from the scope and spirit of the invention.

What is claimed is:

1. A semiconductor integrated circuit, comprising:
   a first power supply line configured to supply a given voltage;
   a second power supply line disposed separately from the first power supply line;
   a switch connected between the first power supply line and the second power supply line to control whether or not to supply the given voltage from the first power supply line to the second power supply line according to a inputted control signal;
   a first logic circuit connected to the second power supply line to operate based on a voltage generated in the second power supply line;
   a control signal line connected to the switch to supply the control signal to the switch; and
   a terminal connected to the control signal line to output the control signal that propagates through the control signal line to an outside,
   wherein the terminal is connected to a first scan chain, and
   wherein the first scan chain comprises a flip-flop connected to one end of the control signal line; and
   an OR circuit connected to another end of the control signal line.

2. A semiconductor integrated circuit according to claim 1, wherein the first scan chain further comprises a second flip-flop connected to a first input of the OR circuit.

3. A semiconductor integrated circuit according to claim 2, further comprising:
   a second logic circuit configured to operate based on a voltage generated in the first power supply line; and
   a second scan chain different from the first scan chain and comprising at least the second flip-flop, the second scan chain testing an operation of one of the first logic circuit and the second logic circuit.

4. A semiconductor integrated circuit according to claim 3, wherein the OR circuit includes a second input to which a signal that is activated when the second scan chain tests the operation of the one of the first logic circuit and the second logic circuit is input.

5. A semiconductor integrated circuit according to claim 3, wherein the flip-flop comprises a first flip-flop, and wherein the first scan chain outputs the control signal received by the first flip-flop from the control signal line to the terminal, without testing the operation of the first logic circuit.

6. A semiconductor integrated circuit according to claim 3, wherein the control signal comprises a signal output from the second logic circuit.

7. A semiconductor integrated circuit according to claim 2, further comprising a second logic circuit configured to operate based on a voltage generated in the first power supply line,
wherein the flip-flop comprises a first flip-flop,
wherein the first scan chain tests an operation of the second logic circuit, and
wherein the first flip-flop included in the first scan chain holds a signal received from the control signal line and outputs the signal toward the terminal in conjunction with the testing of the operation of the second logic circuit.

8. A semiconductor integrated circuit according to claim 7, further comprising a second scan chain different from the first scan chain, and configured to test an operation of the first logic circuit,
wherein the second scan chain tests the operation of the first logic circuit in conjunction with the testing of the operation of the second logic circuit which is conducted by the first scan chain.

9. A semiconductor integrated circuit according to claim 1,
wherein the control signal line comprises a first signal,
wherein the semiconductor integrated circuit further comprises a second control signal line that is disposed separately from the first control signal line, and propagates the control signal to the switch, and
wherein the terminal is connected to a logic gate for receiving the control signal from the first control signal line and the control signal from the second control signal line.

10. A semiconductor integrated circuit according to claim 9, wherein the logic gate comprises any one of an AND gate, an OR gate, and an EX-OR gate.

11. A semiconductor integrated circuit according to claim 1,
wherein the control signal line comprises a first signal,
wherein the semiconductor integrated circuit further comprises:
a second control signal line that is disposed separately from the first control signal line, and propagates the control signal to the switch;
a first flip-flop and a second flip-flop for receiving the control signal from the first control signal line and the control signal from the second control signal line, respectively; and
a selector circuit for receiving outputs of the first flip-flop and the second flip-flop, and
wherein the terminal is connected to the selector circuit.

12. A semiconductor integrated circuit according to claim 1,
wherein the control signal line comprises a first signal,
wherein the semiconductor integrated circuit further comprises:
a second control signal line that is disposed separately from the first control signal line, and propagates the control signal to the switch; and
a selector circuit for receiving the control signal from the first control signal line and the control signal from the second control signal line, and
wherein the terminal is connected to the selector circuit.

13. A semiconductor chip, comprising:
a first power supply line configured to supply a given voltage;
a second power supply line disposed separately from the first power supply line;
a switch coupled between the first power supply line and the second power supply line to control whether or not to supply the given voltage from the first power supply line to the second power supply line according to a control signal;
a logic circuit coupled to the second power supply line to operate based on a voltage generated in the second power supply line;
a control signal line coupled to the switch to supply the control signal to the switch; and
a terminal configured to output both the control signal that propagates through the control signal line and another signal different from the control signal to an outside of the semiconductor chip.

14. A semiconductor chip, comprising:
a first power supply line;
a second power supply line;
a switch coupled between the first power supply line and the second power supply line;
a logic circuit coupled to the second power supply line;
a control signal line coupled to the switch; and
a terminal configured to output both a control signal that propagates through the control signal line and another signal different from the control signal to an outside of the semiconductor integrated circuit.

15. The semiconductor chip according to claim 14, further comprising a signal path transmitting the another signal.

16. The semiconductor chip according to claim 15, wherein the terminal is coupled to the signal path.

* * * * *